United States Patent [19]

Schneider et al.

[11] 4,362,990

[45] Dec. 7, 1982

[54] CURRENT- AND VOLTAGE-MEASUREMENT TRANSDUCER

[75] Inventors: Gernot Schneider, Baar; Werner Trinkler, Zug; Mathis Halder; Eva Blazsó, both of Baar; Jocob de Vries, Allenwinden; Konrad Schürmann, Cham; Hans Muntwyler, Baar, all of Switzerland

[73] Assignee: LGZ Landis & Gyr Zug AG, Zug, Switzerland

[21] Appl. No.: 138,005

[22] Filed: Apr. 7, 1980

[30] Foreign Application Priority Data

Apr. 20, 1979 [CH] Switzerland ........................ 3724/79

[51] Int. Cl.[3] ........................ G01R 1/20; G01R 33/00; H01F 1/00

[52] U.S. Cl. ................................ 324/117 R; 324/127; 324/249; 336/212

[58] Field of Search ............... 324/117 R, 117 H, 127, 324/251, 252, 253, 249; 336/212

[56] References Cited

U.S. PATENT DOCUMENTS 2,608,610 8/1952 Thulin .

FOREIGN PATENT DOCUMENTS 2734729 8/1978 Fed. Rep. of Germany .
471448 5/1969 Switzerland .
593544 12/1977 Switzerland .

OTHER PUBLICATIONS

Reference Data for Radio Engineers; Howard W. Sams & Co., Inc., N.Y., N.Y.; pp. 13-21 through 13-23; 1977.
Schernus et al; "A New Digital Method . . . "; IEEE Trans. on Instrumentation & Meas.; vol. IM-21; No. 4; Nov. 1972; pp. 346-349.

*Primary Examiner*—Ernest F. Karlsen
*Attorney, Agent, or Firm*—Ernest F. Marmorek

[57] ABSTRACT

A transducer for measuring a current, includes a magnetic core which has a gap substantially impeding passage of any magnetic flux, a coil arranged to pass a premagnetizing current for producing a first magnetic field, a loop for carrying the current to be measured, so as to produce a second magnetic field, and a magnetic field comparision device exposed to the magnetic fields. The magnetic field comparison device includes a magnetic film bridging the flux gap. The film is alternately controllable in respective opposite directions of saturation substantially by the first magnetic field, and evaluates the measuring current in dependence of the magnetic fields. The magnetic core, the coil, the loop, and the magnetic film are substantially disposed concentrically.

16 Claims, 21 Drawing Figures

CURRENT- AND VOLTAGE-MEASUREMENT TRANSDUCER

CROSS-REFERENCE TO RELATED APPLICATIONS

Cross reference is made to Application Ser. No. 918,446 now U.S. Pat. No. 4,309,655, assigned to the assignee of the present invention, and filed by Heinz Lienhard and Gernot Schneider.

BACKGROUND OF THE INVENTION

From the German Pat. No. DE 2 734 729 there is known a measurement transformer in which a magnetic core surrounds a current-measuring conductor (the measurement transformer) in a tongue-like manner, and includes a pre-magnetizing winding. External to the pre-magnetizing winding passage of the magnetic flux through the magnetic core is impeded by an air gap, which is bridged by a very thin magnetic film. When the magnetic field, generated by an alternating pre-magnetizing current, and the measuring current, crosses zero, the magnetic film is re-magnetized into an opposite direction of saturation, which in turn induces an output pulse in the pre-magnetizing winding. Any deviation of the output pulse from its normal time position, (in the absence of any current passing through the current-measuring conductor,) represents an indication of the magnitude of the current to be measured, which passes through the measuring conductor. The theoretical basis for the aforenoted measurement principle is discussed in the IEEE Transactions on Instrumentation and Measurement, Vol. IM-21, Nr. 4, November 1972, pp. 346–349.

No prior art is known which optimizes the constructional features of a measurement transformer of the aforedescribed kind, although pot-shaped magnetic cores are known from the ITT Reference Data for Radio Engineers, pages 13–21, published by Howard W. Sams & Co.

SUMMARY OF THE INVENTION

One of the principal objects of the invention is to increase the measurement accuracy of current- and voltage-measuring transducers of the aforenoted type.

In the current- and voltage-measuring transformer of the present invention, the magnetic flux due to the premagnetization current and the measurement current generate, in turn, a magnetic field which continuously remagnetizes the magnetic film. Because the accuracy of measurement is partly proportional to the efficiency of the "current-to-time indication" conversion process, the velocity of remagnetization which can be achieved is an important feature in transducers of the aforedescribed kind.

The velocity of remagnetization of the magnetic film is very high, and a change in magnetization can be accomplished, for example, in five microseconds. The resulting rapid change in reactance takes place in known transducers in the magnetic cores and the premagnetization coil, from where an appropriate voltage change or timing indication can be obtained. The limiting frequency of the soft magnetic material of the magnetic core of transducers of the prior art yields an apparent increase of the dynamic coercive field force, a reduced signal voltage, a reduced signal steepness, and an increased impulse width. The transducer, according to the present invention, provides significant improvements compared to those of the prior art. It yields larger and steeper output pulses than available from transducers of the prior art, which output pulses can be detected at a commensurately higher velocity.

In a further development of the invention, the magnetic film is screened from any extraneous interfering fields, which further improves the measurement accuracy. This shielding further prevents radiation of any interfering fields by the transducer itself.

Further objects and advantages of the invention will be set forth in part in the following specification, and in part will be obvious therefrom, without being specifically referred to, the same being realized and attained as pointed out in the claims hereof.

BRIEF DESCRIPTION OF THE DRAWING

For a fuller understanding of the nature and objects of the invention, reference should be had to the following detailed description, taken in connection with the accompanying drawings, in which.

DESCRIPTION OF THE PREFERRED EMBODIMENTS

Figure 1:
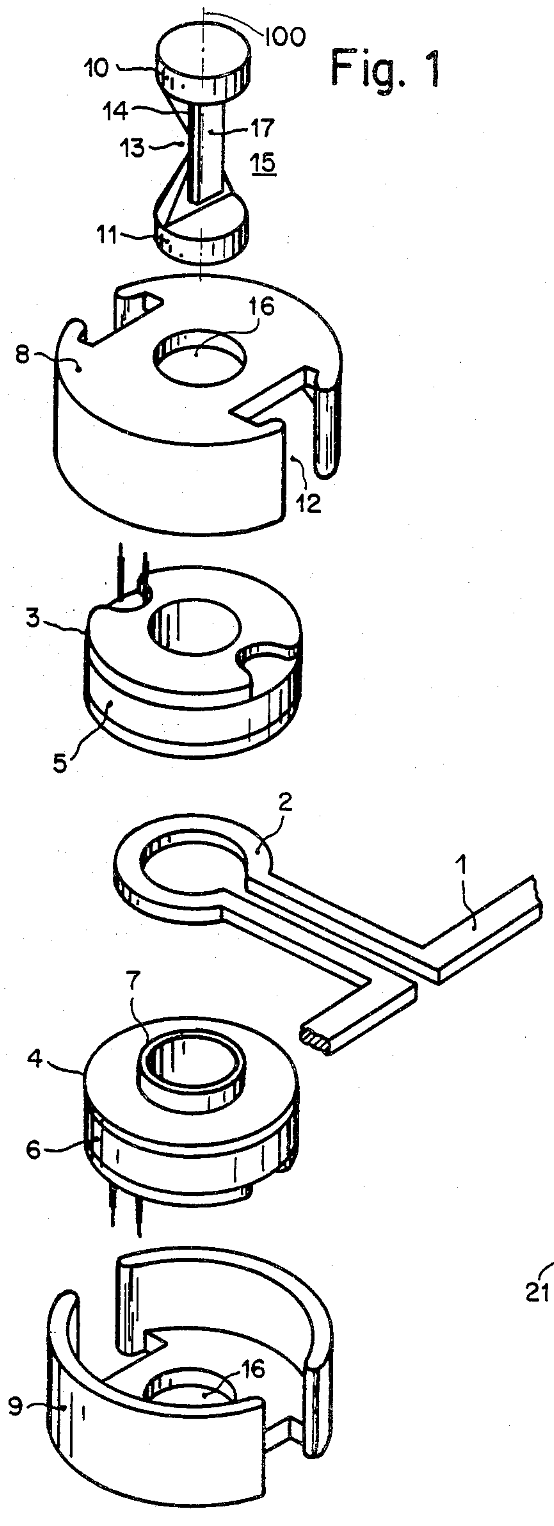
FIG. 1 is the transducer, according to the invention, shown exploded in perspective view.

In carrying the invention into effect, there is shown in FIG. 1 a measurement transducer, which passes a current to be measured, and which, in the example illustrated, comprises magnetic core means, including, for example, a central core, composed, for example, of pole members 10 and 11, and loop means such as, for example, a loop 2, surrounding the central core. The loop 2 passes the current to be measured, and the current in turn generates a magnetic field. In the assembled transducer, the loop 2 is disposed coaxially between coil means, such as, for example, two bobbins 3 and 4, on which there are wound respective disc-shaped windings 5 and 6 about a central common axis 100. The windings 5 and 6 and the associated bobbins 3 and 4, respectively, are an example of coil means arranged to pass a premagnetizing current for producing a magnetic field, for purposes to be described later. The windings 5 and 6 are, for example, connected electrically in series, and form a pre-magnetization winding. An annular portion 7 of the bobbin 4 serves to center the loop 2 of the measurement transducer of the invention.

An upper shell half 8, a coaxially disposed lower shell half 9, and two coaxial pole members 10 and 11 shaped approximately like segments of a truncated cone, and capped with cylindrical pole shoes, form a magnetic core made of ferrite. The shell formed from the shell halves 8 and 9 surrounds the loop 2 and the pre-magnetization coils 5 and 6; openings 12 in the shell permit insertion of the loop 2, thereinto, and the insertion of (non-illustrated) leads, for making contact with the pre-magnetization coils 5 and 6. The pole members 10 and 11 form a central core, and pass through the bobbins 10 and 11, respectively. The pole members 3 and 4 are spaced at a relatively small distance from one another, so that an air gap 13 is formed therebetween, which is bridged by magnetic field comparison means, such as a magnetic film 14. The pole members 10 and 11 may be fitted or capped with pole shoes of highly permeable material, so as to concentrate the magnetic field within the air gap 13 in an optimal manner. Thus it will be seen that the pre-magnetization windings 5 and 6, the loop 2 of the current measuring member 1, the central core of the core means provided with an air gap 13, and the magnetic film 14 which bridges the airgap 13, are disposed in a substantially concentric manner about a common center axis 100, as shown, for example, in FIG. 1.

In the example described, the loop 2 passes the current to be measured, and the magnetic field generated by the pre-magnetizing current carried by the coil means, such as windings 5 and 6, alternately drives the magnetic field comparison means, such as the magnetic film 14, which bridges the gap 13, in respective opposite direction of saturation. The magnetic film 14 evaluates the current passing through the loop 2 by way of the magnetic field generated by the loop current. As is known, the loop current causes a deviation of the time slot of the zero crossing of the magnetic field due to the alternating premagnetizing current in the windings 5 and 6 from a normally occupied central position (in the absence of any loop current). The zero crossing of the magnetic field as is known, in turn generates an output pulse, whose time deviation from the central position is proportional to the magnitude and direction of the loop current.

The pole members 10 and 11, and the magnetic film 14 are joined so as to constitute an insert portion 15, whose end portions formed by the cylindrical pole shoes of the pole members 10 and 11 may be inserted into appropriate openings 16 of the respective shell halves 8 and 9 in a play-free manner. This construction has the advantage that the insert member 15, together with the magnetically sensitive magnetic film 14, may be inserted into the shell surrounding the magnetic core, following assembly of the remaining parts of the measurement transducer.

In the example shown in FIG. 1, the magnetic film 14 is applied on a substrate 17 of non-magnetic material, and glued together therewith on plain surfaces 18 of the segments of the truncated core portions 18, of the pole members 10 and 11.

The magnetic film 14 is preferably very thin and magnetically anisotropic, as discussed in the cross-referenced application. It is also possible to make the magnetic film 14 of magneto-resistive material, and provide it with contacts, so as to connect it to a current source, or to a voltage source.

Figure 3:
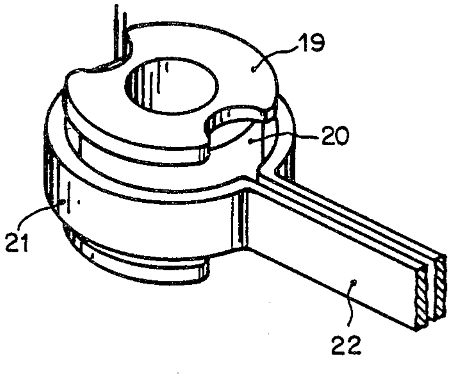
FIG. 3 is a premagnetization coil, and a loop for carrying the measurement current, shown exploded in perspective view.

In dependence of the current to be measured, the measurement member 1 may include one or several loops 2. For the purpose of measuring very large currents it may be part of a current divider. Voltage measurements may be obtained, for example, by arranging the measurement member 1 in series with a resistor of high ohmic value. Instead of the windings 5 and 6, which include the loop 2 of the measurement member 1, as seen in FIG. 3, a pre-magnetization winding 20, which is wound on a bobbin 19, may be used, which is in turn surrounded by a loop 21 of a measurement member 22. The measurement member 2 is preferably a looped strip, while the measurement member 1 may be obtained from punching a metal sheet.

Figure 4:
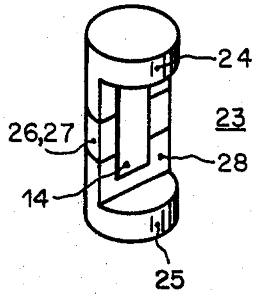
FIG. 4 is an alternate version of the insert portion, in perspective view.
Figure 5:
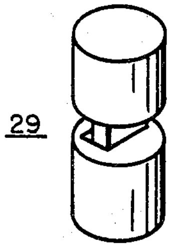
FIG. 5 is still an alternate portion of the insert portion shown in perspective view.
Figure 6:
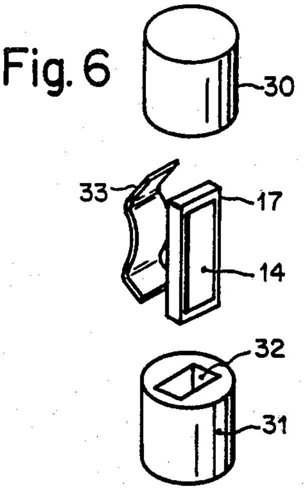
FIG. 6 is the insert portion of FIG. 5, shown exploded in perspective view.

In FIG. 4 there is shown an insert member 23, which can be used in lieu of insert member 15; its pole members 24 and 25 are connected by means of a non-magnetic material 27 bridging the gap 26; the insert member 23 consists of two cylindrical end portions and a half cylindrical portion. Each pole member 24 and 25 has a substantially plane surface, and the non-magnetic material 27 has a flat surface, which surfaces are aligned so as to form a common surface 28, to which the magnetic film 14 is applied. The non-magnetic material 27 may, for example, be glass, and the pole members 24 and 25 may, for example, be sintered or brazed to the glass member 27. An insert member 29, shown in FIG. 5, consists, as illustrated in FIG. 6, of two cylindrical pole members 30 and 31; each pole member 30 or 31 has a rectangular opening 32. There is further provided a substrate 17, which carries the magnetic film 14, and a leaf-spring 33.

The ends of the substrate 17 are disposed in the openings or apertures 32, and the magnetic film 14 is urged by the leaf-spring 33 to exert a pressure against respective plane interior surfaces of the pole members 30, and 31.

Figure 7:
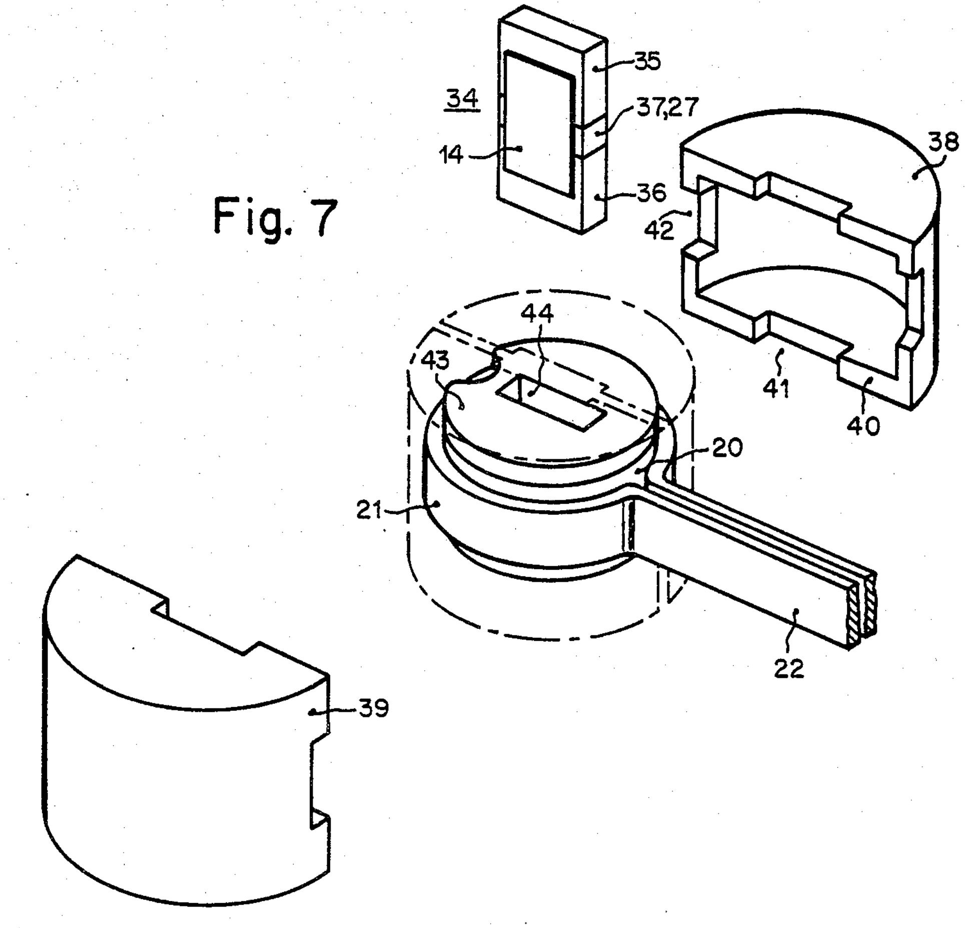
FIG. 7 is another version of the transducer, shown in perspective view.

In FIG. 7 there is shown a transducer in an exploded view; its insert member 34 forms again the central core of a core means, but uses rectangularly shaped pole pieces 35 and 36. These are connected to one another by means of a non-magnetic material 27, taking the place of an air gap 37, and the air gap is bridged by means of a magnetic film 14. The shell consists of two shell halves 38 and 39, which are laterally joined, so that their respective contact surfaces 40 are disposed along the direction of the magnetic flux, and not at right angles thereto, as is the case for the shell halves 8 and 9 of FIG. 1. This has the advantage that the shell halves 38 and 39 do not include any magnetically effective air gap. Recesses 41 of the respective shell halves 38 and 39 serve to receive the end portions of the insert 34, while the recesses 42 permit passage of the measurement member 22, and leads for making contact with the pre-magnetization winding 20; the winding 20 is disposed on a bobbin 43 provided with a rectangular opening 44.

The manufacture of the measurement transducer, according to FIG. 7, is particularly simple, as only a few surfaces, namely the contact surfaces between the shell portions 38 and 39, and the pole members 35 and 36, respectively, need to be of a high quality, as these surfaces are plane. The insert member 34 is particularly suitable for mass production, as a multiplicity of such insert members can be manufactured in the form of a single plate. The individual insert members are, for example, individually broken off from the plate only after the magnetic film 14 has been applied to the plate.

Figure 8:
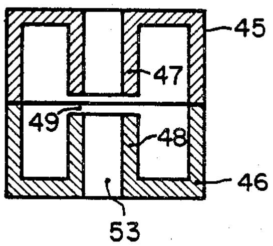
FIG. 8 is an elevation view of a magnetic core, in section.

FIG. 8 is an elevation view in section of a magnetic core which consists of two coaxial shell halves 45 and 46, and a center core in the form of respective hollow rods 47 and 48, integral with the shell halves 47 and 48, respectively. An air gap 49 is formed between the hollow rods 47 and 48. An insert member 50 shown in FIG. 9 consists of a rod-shaped substrate 51 of non-magnetic material, and a magnetic film 52, which is disposed on the circumference of the substrate 51. The insert member 50 may be inserted into an axial bore 53 common to the hollow rods 47 and 48, following assembly of the shell halves 45 and 46, and is received in the bore 53 without any play.

Figure 10:
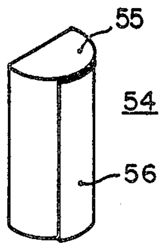
FIG. 10 is still another version of the insert portion shown in perspective view.

Instead of the insert member 50, it is also possible to use an insert member 54, shown in FIG. 10, whose rod-shaped substrate 55 has a cross-section in the form of a semi-circle. A magnetic film 56 covers only a relatively narrow strip of the circumference of the substrate 55. The insert member 54 may be inserted in conjunction with a (non-illustrated) spring into the bore 53, so that the spring urges the magnetic film 56 against the walls bordering the bore 53.

Figure 2:
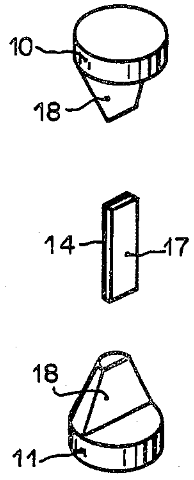
FIG. 2 is an insert portion including a magnetic film insertable into the core, shown exploded in perspective view.
Figure 9:
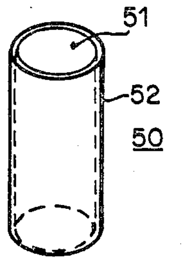
FIG. 9 is an alternate form of an insert portion shown in perspective view.

It is alternately possible to use as an insert member a rectangularly-shaped substrate 17 with a magnetic film 14, as shown in FIG. 2, if the bore 53 common to the hollow rods 47 and 48 has a corresponding rectangular cross-section. The magnetic circuit of the measurement transformer, as shown in FIGS. 8 through 10, has a minimal number of constructional elements, and is designed for optimal magnetic effects.

Figure 11:
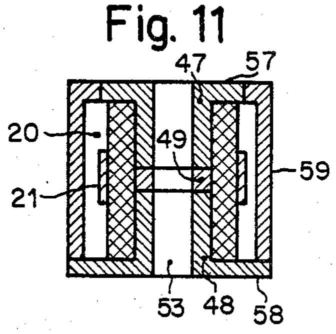
FIG. 11 is an elevation view of a section of the core, with a coil surrounding the core.

The magnetic core illustrated in FIG. 11 is only very slightly different from the magnetic core shown in FIG. 8, and consists of three core portions 57, 58 and 59. The shell core portions 57 and 58 include the hollow rods 47 and 48, are connected to one another by means of a non-magnetic material replacing the air gap 49, and serve as bobbins for the pre-magnetization winding 20, and the loop 21 of the measurement member. The outer core portion 59 is pot-shaped, has a central opening, and surrounds the central core portion consisting of the core portions 57 and 58.

Figure 12:
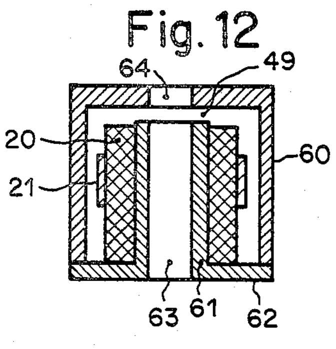
FIG. 12 is an elevation view of an alternate version of the core, with a coil surrounding the core.

In FIG. 12 there is shown a core, which consists of a pot-shaped core portion 60, a hollow rod or cylinder 61, and a core portion 62 formed with an annular flange; the core portion 62 serves as a bobbin. An air gap 49 is formed between the top surface of the hollow rod 61, and a corresponding part of the core portion 60; the core portion 60 has an opening 64 aligned with a bore formed in the hollow rod 61.

Figure 13:
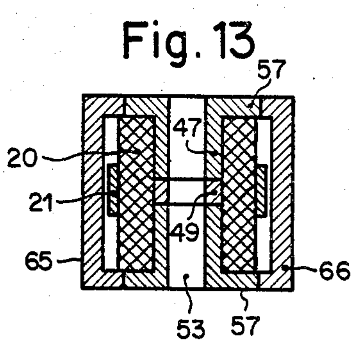
FIG. 13 is an elevation view of still an alternate version of the core, with a coil surrounding the core.
Figure 14:
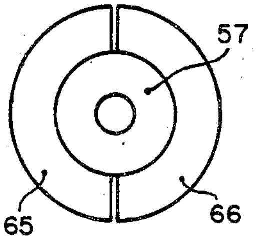
FIG. 14 is a plan view of the core shown in FIG. 13.

FIGS. 13 and 14 show a quadruple-portioned magnetic core, whose central core is formed by two identical core portions 57, which also serves as a bobbins. The hollow cylindrical parts, 47 of the respective core portions 57 are connected to one another by a non-magnetic material, which replaces the air gap 49. Two shell-halves 65 and 66 surround the shell portions 57.

It will be understood that the insert member 50, or the insert member 54 of FIG. 10, may be inserted into the central openings 53 and 63 of the respective cores shown in FIGS. 8, 11, 12 and 13, following assembly of the cores.

Figure 15:
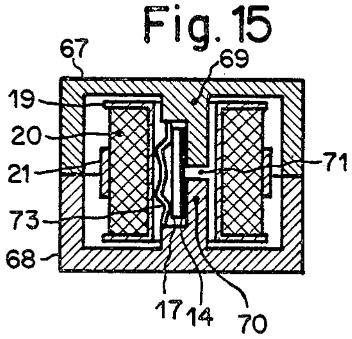
FIG. 15 is an elevation view of a core in section.
Figure 16:
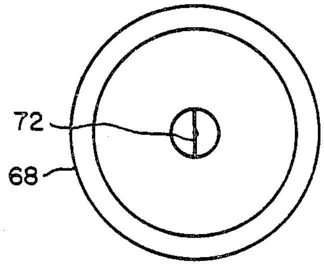
FIG. 16 is a plan view of one-half the shell of the transducer shown in FIG. 15.

The measurement transducer shown in FIGS. 15 and 16 combines the advantages of a simple core consisting of only two parts, and of a flat magnetic film, which can be easily manufactured. The core of this measurement transducer consists of two axially joined core portions 67 and 68 with central projections 69 and 70 integral therewith, which projections serve as a central core, and which have surfaces facing one another which define an air gap 71. The ends of the projections 69 and 70 have a semi-circular cross-section, and are formed with plane surfaces 72 perpendicular to the semi-circular cross-sections. A spring 73 presses a magnetic film 14, which is disposed on the substrate 17, against the surfaces 72.

During assembly of the measurements transducer, the bobbins 19 and its pre-magnetization winding 20, the loop 21 of the measurement member, the substrate 17 with it magnetic film 14, and the spring 73 are inserted into the lower shell half 68. The spring 73 is constructed, so that it does not initially exert any pressure against the substrate 17; thus the upper shell half 67 may be easily slipped onto the part-assembled lower portion of the transducer. Upon joining of the two shell-halves 67 and 68, the spring 73 is compressed along its longitudinal direction, so that it is forced to bulge laterally.

The magnetic film 14, 52 and 56 may, as has already been stated, be made of magneto-resistive material, and be connected to a current- or voltage-source. A magneto-resistive magnetic film of this type changes its resistance during a zero crossing of the magnetic field. This change in resistance, in turn, is manifested by a narrow voltage or current impulse, which determines the deviation, of the zero crossing of the magnetic field from its normal time slot (in the absence of any current passing through the measurement member) unambiguously, and with great accuracy.

Figure 17:
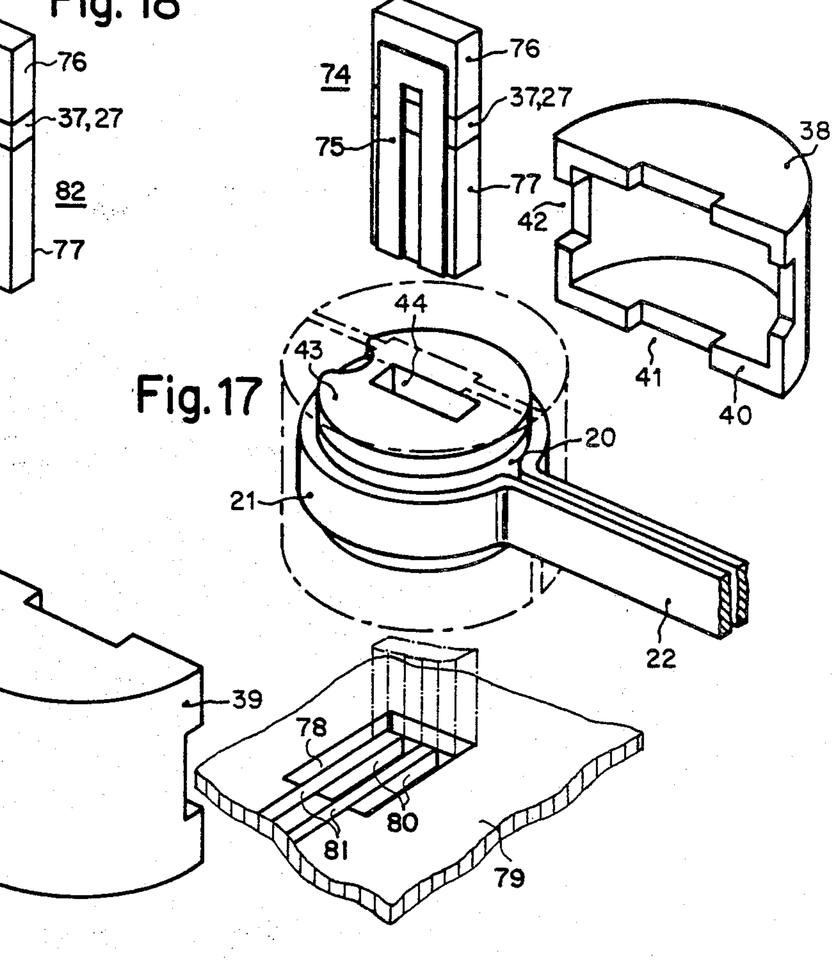
FIG. 17 is a version of the transducer including a magneto-resistive magnetic film shown exploded in perspective view.

In FIG. 17 there is shown a measurement transducer, which is constructed in a fashion similar to the measurement transducer of FIG. 7, but whose insert member 74 includes a magneto-resistive film 75. This insert member 74 consists of pole members 76 and 77, (which are connected to one another by a non-magnetic material 27 replacing an air gap 37,) and of the magnetoresistive or magnetic film 75, which is disposed on a substrate formed by the pole members 76 and 77, and the non-magnetic material 27.

It is also possible to apply the magnetic film 75 on a separate substrate consisting of a magnetically and electrically non-conducting material, for example, on the substrate 17 of FIGS. 1 and 2, and to glue the magnetic film 75 together with the substrate 17 onto the flat parts of portions 27, 76 and 77. Between the pole members 76 and 77 and the magnetic film 75, on the one hand, and between the magnetic film 75, and the shell half 39, on the other hand, there may be disposed an insulation layer. This is not, however, absolutely necessary, as the electrical resistance of the pole members 76 and 77, and of the shell half 39 is generally large, in comparison to that of the magnetic film 75.

In the example illustrated, the magnetic film 75 is U-shaped, whose end portions bridge the air gap 37, and also serve as electrical contacts. The pole member 77 projects somewhat beyond the assembled shell halves 38 and 39, and may then be inserted into an E-shaped recess 78 of an at least partly conductive plate 79. As a result of the recess 78 there are formed resilient tongues, which include on their upper portion, as well as on their end portions, electrically conducting strips 81, which in turn either exert pressure on the end portions of the magnetic film 75, or else are permanently soldered or braised thereto.

Figure 18:
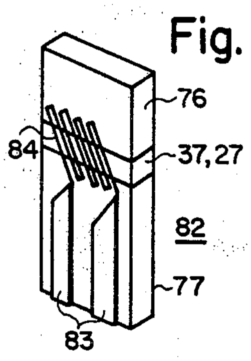
FIG. 18 is an insert including a magneto-resistive film shown in perspective view.

In FIG. 18 there is shown an insert member 82, whose magneto-resistive magnetic film 83 and 84 is formed from two parallel strips 83, (which serve as leads to carry the current, as well as contacts) and from a magneto-resistive element 84, which forms a meander-shaped conductive path. The conductive path, which has a very narrow cross-section in comparison to the strip 83, traverses the airgap 37 a plurality of times in a direction forming an angle of about 45° with respect to the magnetic flux produced by the magnetic fields. The manufacture of the strips 83 and the conductive path 84 can be accomplished by evaporating a magnetic film onto the substrate 26, 27 and 77, and subsequently partially removing the magnetic film by a photolithic process.

By an appropriate choice of the width of the conductive path 84, any desired electrical resistance of the conductive path can be realized, using a uniform layer thickness of the magnetic films 83 and 84. The change of resistance of the magnetic film due to a changing magnetic field is maximized by orienting the conductive path 84 in a direction forming an acute angle with the magnetic flux.

Figure 19A:
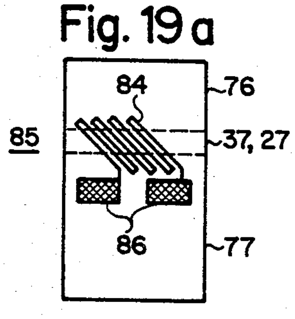
FIG. 19*a* is an elevation view of another version of an insert portion during the manufacturing process thereof.
Figure 19B:
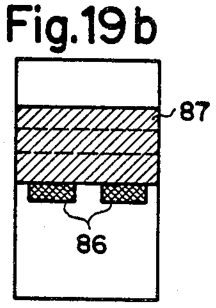
FIG. 19*b* is an elevation view of the insert portion of FIG. 19*a* during a further manufacturing stage.
Figure 19C:
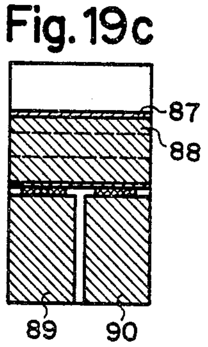
FIG. 19*c* is an elevation view of the insert portion of FIG. 19*a* during an advanced stage of manufacture.

The insert member 85, according to FIG. 19*a*, consists of a substrate 76, 27 and 77, and of a magneto-resistive magnetic film, which forms a conductive path 84, and two contact surfaces 86, respectively; according to FIG. 19*b*, there is applied a very thin insulating layer 87, for example, a glass layer, to the magnetic film 84, so as to cover it, but to leave free the downwardly projecting contact surfaces 86. Subsequently there are applied in one step, as can be seen from FIG. 19*c*, three magnetic layers 88, 89 and 90, to the aforesaid partially completed insert member, which layers are considerably thicker than the magnetic film 84, 86, and which do not make contact with one another. The magnetic layer 88 lies on top of the insulating layer 87, and serves to couple the magnetic field to the conductive path formed by the magneto-resistive element 84 in a known manner. The magnetic layers 89 and 90 are partially disposed on the contact surfaces 86, and also serve to supply current thereto.

We wish it to be understood that we do not desire to be limited to the exact details of construction shown and described, for obvious modifications will occur to a person skilled in the art.

Having thus described the invention, what we claim as new and desire to be secured by Letters Patent, is as follows:

1. A transducer for measuring a current, comprising in combination:

magnetic core means having a gap normally impeding passage of any magnetic flux, including a shell, coil means arranged to pass a premagnetizing current for producing a first magnetic field, loop means arranged to pass the current to be measured so as to produce a second magnetic field, said shell surrounding said coil means and said loop means, and magnetic field comparison means exposed to said magnetic fields, said magnetic field comparison means including magnetic film means bridging said flux gap and being alternately driveable in respective opposite directions of saturation substantially by said first magnetic field, and evaluating said measuring current in dependence of said magnetic fields, said magnetic core means, said coil means, said loop means, and said magnetic field comparison means having a common axis, and being substantially disposed concentrically about said axis.

2. A transducer as claimed in claim 1, wherein said magnetic core means includes a central core having said flux gap, said central core including first and second pole members connected to said magnetic film means on opposite ends thereof, said shell having first and second openings for receiving said first and second pole members, respectively, in a play-free manner.

3. A transducer as claimed in claim 2, wherein each pole member has a substantially plane surface, and wherein said central core includes a non-magnetic substrate being adhesively attached together with said magnetic film means to said plane surfaces.

4. A transducer as claimed in claim 2, further comprising a magnetically non-conductive material connecting said pole members to one another, having an outer, substantially flat surface, and constituting said flux gap, and wherein each pole member has a substantially plane surface, said magnetic film means being disposed on said surfaces.

5. A transducer as claimed in claim 2, wherein said central core includes a non-magnetic substrate, said magnetic film means being disposed on said substrate, and wherein each pole member has a substantially plane surface, and an aperture, opposite ends of said substrate and said film means being disposed in said apertures, respectively, and further comprising spring means at least partly disposed in said apertures for urging said film means to exert pressure against said surfaces.

6. A transducer as claimed in claim 1, wherein said magnetic core means includes a central core having an axial bore, and further comprising a rod-shaped substrate of non-magnetic material, said magnetic film means being disposed on at least a portion of the circumference of said substrate, said substrate and said magnetic film means being located in a play-free manner in said axial bore.

7. A transducer as claimed in claim 1, wherein said gap is an air gap, and wherein said magnetic core means includes a central core having a substantially flat interior surface bordering said air gap, and further comprising a substrate, said magnetic film means being disposed on said substrate, and spring means disposed in said central core for urging said magnetic film means to exert pressure on said interior surface.

8. A transducer as claimed in claim 1, wherein said magnetic fields produce a flux having a predetermined direction, and wherein said shell includes first and second half-shells having respective contact surfaces disposed in said predetermined direction.

9. A transducer as claimed in claim 1, wherein said magnetic core means forms a bobbin for said coil means.

10. A transducer as claimed in claim 1, wherein said magnetic film means includes magnetoresistive means formed with a pair of contact surfaces for passing current therethrough.

11. A transducer as claimed in claim 1, further comprising at least a partially conductive plate having a recess, and wherein said magnetic core means includes a central core having said flux gap, and said magnetic film means includes magnetoresistive means formed with contact surfaces, said central core being at least partially insertable into said recess, whereby current is passable through said conductive plate to said contact surfaces.

12. A transducer as claimed in claim 10, wherein said magnetic fields produce a flux having a predetermined direction, wherein said gap is an airgap, and said magnetoresistive means is conductive, and arranged to traverse said airgap a multiple number of times in a direction forming an angle of about 45° with said predetermined direction.

13. A transducer as claimed in claim 1, adapted to measure a voltage across a predetermined resistor, and wherein said loop means has a prearranged impedance substantially negligible in comparison to said pre-determined resistor, and is connectable in series with said predetermined resistor.

14. A transducer as claimed in claim 10, further comprising first and second magnetic layers electrically insulated and spaced from each other for making contact with said pair of contact surfaces.

15. A transducer for measuring a current, comprising in combination:

magnetic core means having a gap normally impeding passage of any magnetic flux, including a shell having first and second openings, coil means arranged to pass a premagnetizing current for producing a first magnetic field, loop means arranged to pass the current to be measured so as to produce a second magnetic field, said shell surrounding said coil means and said loop means, magnetic field comparison means exposed to said magnetic fields, said magnetic field comparison means including magnetic film means bridging said flux gap and being alternately driveable in respective opposite directions of saturation substantially by said first magnetic field, and evaluating and measuring current in dependence of said magnetic fields, and first and second pole members connected to said magnetic field comparison means on opposite ends thereof and received in said first and second openings, respectively in a play-free manner, said magnetic core means, said coil means, said loop means, and said magnetic field comparison means having a common axis, and being substantially disposed concentrically about said axis.

16. A transducer for measuring a current, comprising in combination:

magnetic core means having a gap normally impeding passage of any magnetic flux, including first and second half shells forming a shell, said shell having first and second openings, each half-shell having a contact surface, coil means arranged to pass a premagnetizing current for producing a first magnetic field, loop means arranged to pass the current to be measured so as to produce a second magnetic field, said shell surrounding said coil means and said loop means, said magnetic fields producing a flux having a predetermined direction, said contact surfaces being disposed in said predetermined direction, magnetic field comparison means exposed to said magnetic fields, said magnetic field comparison means including magnetic film means bridging said flux gap and being alternately driveable in respective opposite directions of saturation substantially by said first magnetic field, and evaluating said measuring current in dependence of said magnetic fields, first and second pole members each having a substantially flat surface, connected to said magnetic field comparison means on opposite ends thereof and received in said first and second openings, respectively in a play-free manner, and a magnetically non-conductive material having an outer, substantially plane surface and connecting said pole members to one another, said magnetic field comparison means being disposed on said flat surfaces, said magnetic core means, said coil means, said loop means, and said magnetic field comparison means having a common axis, and being substantially disposed concentrically about said axis.

* * * * *